(12) United States Patent
Snodgrass et al.

(10) Patent No.: US 10,365,900 B2
(45) Date of Patent: Jul. 30, 2019

(54) BROADENING FIELD SPECIALIZATION

(71) Applicants: The Arizona Board of Regents on Behalf of the University of Arizona, Tucson, AZ (US); DATAWARE VENTURES, LLC, Tucson, AZ (US)

(72) Inventors: Richard T. Snodgrass, Tucson, AZ (US); Saumya K. Debray, Tucson, AZ (US); Rui Zhang, Tucson, AZ (US)

(73) Assignees: DATAWARE VENTURES, LLC, Tucson, AZ (US); THE ARIZONA BOARD OF REGENTS ON BEHALF OF THE UNIVERSITY OF ARIZONA, Tucson, AZ (US)

(*) Notice: Subject to any disclaimer, the term of this patent is extended or adjusted under 35 U.S.C. 154(b) by 497 days.

(21) Appl. No.: 14/968,296

(22) Filed: Dec. 14, 2015

(65) Prior Publication Data

US 2016/0110172 A1 Apr. 21, 2016

Related U.S. Application Data

(63) Continuation-in-part of application No. 14/368,265, filed as application No. PCT/US2012/071468 on Dec. 21, 2012, now Pat. No. 9,607,017.
(Continued)

(51) Int. Cl.
*G06F 9/44* (2018.01)
*G06F 8/36* (2018.01)
(Continued)

(52) U.S. Cl.
CPC ............... *G06F 8/36* (2013.01); *G06F 8/433* (2013.01); *G06F 9/44521* (2013.01); *G06F 17/5009* (2013.01)

(58) Field of Classification Search
None
See application file for complete search history.

(56) References Cited

U.S. PATENT DOCUMENTS

| 5,202,995 A | 4/1993 | O'Brien | 395/700 |
| 5,493,675 A | 2/1996 | Faiman | 717/144 |

(Continued)

FOREIGN PATENT DOCUMENTS

| JP | S62274433 | 11/1987 | G06F 17/30 |
| JP | H07234793 | 9/1995 | G06F 9/38 |

(Continued)

OTHER PUBLICATIONS

Wei et al., "Practical Blended Taint Analysis for JavaScript," Copyright 2013 ACM.*

(Continued)

*Primary Examiner* — Insun Kang
(74) *Attorney, Agent, or Firm* — Hayes Soloway P.C.

(57) ABSTRACT

Three extensions to the conventional field specialization process are disclosed. The first extension is cross-application value flows, where a value transfers out of one application and subsequently into another application. The second extension is an inter-application analysis. Static and dynamic analysis is performed by a Spiff Toolset not just on the source code of a single application, but also across the data read and written by that application. The third extension is invariant cross-application termination, verifying the possibility of an invariant originating in an application and terminating in a specialization opportunity in a separate application. An ecosystem specification is disclosed to enable such field specialization broadening. This specification states which applications are involved, what input data sources are read, what intermediate and final data products are produced, and what services are invoked, thereby pro- (Continued)

viding valuable information on how intermediate results are communicated among the various applications.

21 Claims, 6 Drawing Sheets

Related U.S. Application Data (60) Provisional application No. 61/630,993, filed on Dec. 23, 2011.

(51) Int. Cl.
*G06F 8/41* (2018.01)
*G06F 9/445* (2018.01)
*G06F 17/50* (2006.01)

(56) References Cited

U.S. PATENT DOCUMENTS

| | | | |
|---|---|---|---|
| 5,787,418 A | 7/1998 | Hibbetts | |
| 5,842,022 A | 11/1998 | Nakahira et al. | 395/709 |
| 5,842,209 A | 11/1998 | Mocek | |
| 5,999,924 A | 12/1999 | Bair et al. | 707/4 |
| 6,085,035 A | 7/2000 | Ungar | 395/705 |
| 6,427,234 B1* | 7/2002 | Chambers | G06F 9/45516 717/140 |
| 6,487,713 B1* | 11/2002 | Cohen | G06F 8/34 717/105 |
| 6,560,693 B1 | 5/2003 | Puzak et al. | 712/207 |
| 6,622,300 B1 | 9/2003 | Krishnaswamy et al. | 717/130 |
| 6,634,022 B1* | 10/2003 | Leermakers | G06F 8/443 717/116 |
| 6,925,630 B1* | 8/2005 | Britton | G06F 8/51 717/106 |
| 6,961,930 B1* | 11/2005 | Waldspurger | G06F 11/3419 717/131 |
| 7,039,909 B2 | 5/2006 | Wu et al. | 717/156 |
| 7,131,119 B2 | 10/2006 | Kumar | 717/150 |
| 7,146,352 B2 | 12/2006 | Brundage et al. | 707/2 |
| 7,254,810 B2 | 8/2007 | Barsness et al. | 717/160 |
| 7,373,641 B2 | 5/2008 | Ogasawara | 717/151 |
| 7,730,468 B1* | 6/2010 | Trowbridge | G06F 9/44547 717/139 |
| 8,032,509 B2 | 10/2011 | Piedmonte | 707/708 |
| 8,640,107 B2 | 1/2014 | Jaeger | 717/126 |
| 9,122,523 B2 | 9/2015 | Pienaar | |
| 2001/0042240 A1 | 11/2001 | Ng | G06F 8/427 |
| 2002/0147969 A1 | 10/2002 | Lethin et al. | 717/138 |
| 2003/0126151 A1 | 7/2003 | Jung | |
| 2003/0145314 A1 | 7/2003 | Nguyen et al. | 717/158 |
| 2003/0200537 A1 | 10/2003 | Barsness et al. | 717/151 |
| 2004/0117359 A1 | 6/2004 | Snodgrass et al. | 707/3 |
| 2004/0133747 A1 | 7/2004 | Coldewey | 711/137 |
| 2004/0243555 A1 | 12/2004 | Bolsius et al. | 707/3 |
| 2005/0050533 A1 | 3/2005 | Koseki | G06F 8/441 |
| 2005/0188364 A1 | 8/2005 | Cockx | G06F 8/456 |
| 2005/0192951 A1 | 9/2005 | Day et al. | 707/3 |
| 2006/0026116 A1 | 2/2006 | Day et al. | 707/1 |
| 2006/0036398 A1* | 2/2006 | Funge | G06N 5/02 702/179 |
| 2007/0143357 A1* | 6/2007 | Chaudhri | G06F 17/30017 |
| 2007/0226698 A1* | 9/2007 | Cascaval | G06F 9/45516 717/127 |
| 2007/0239656 A1 | 10/2007 | Santosuosso | 707/2 |
| 2007/0240135 A1* | 10/2007 | Stoodley | G06F 9/45516 717/140 |
| 2008/0052697 A1* | 2/2008 | Stoodley | G06F 9/3851 717/159 |
| 2008/0189277 A1 | 8/2008 | Meijer | |
| 2009/0248725 A1 | 10/2009 | Bhattacharjee et al. | 707/101 |
| 2009/0288064 A1* | 11/2009 | Yen | G06N 5/02 717/106 |
| 2009/0307430 A1* | 12/2009 | Bruening | G06F 12/0862 711/119 |
| 2010/0231224 A1 | 9/2010 | Lindqvist | 234/365 |
| 2011/0072419 A1* | 3/2011 | Archambault | G06F 8/43 717/146 |
| 2012/0079464 A1* | 3/2012 | De Smet | G06F 17/30427 717/143 |
| 2012/0317647 A1 | 12/2012 | Brumley et al. | |
| 2013/0054649 A1* | 2/2013 | Potapov | G06F 17/30436 707/792 |
| 2013/0298130 A1 | 11/2013 | Pienaar | 718/102 |
| 2014/0115001 A1 | 4/2014 | Arroyo | 707/772 |
| 2014/0157260 A1 | 6/2014 | Balani | G06F 9/45533 |
| 2014/0189667 A1 | 7/2014 | Kanhere | 717/160 |
| 2014/0365533 A1 | 12/2014 | Debray et al. | 707/803 |
| 2015/0134637 A1 | 5/2015 | Pall | 707/718 |
| 2015/0363294 A1 | 12/2015 | Carback, III | G06F 11/3672 |

FOREIGN PATENT DOCUMENTS

| | | | | |
|---|---|---|---|---|
| JP | 9-91148 | 4/1997 | | G06F 9/45 |
| JP | H10320211 | 12/1998 | | G06F 9/45 |
| JP | 2000187596 | 7/2000 | | G06F 9/45 |
| JP | 2000-315160 | 11/2000 | | G06F 9/45 |
| JP | 2002-073387 | 3/2002 | | G06F 12/00 |
| JP | 2003-196106 | 7/2003 | | G06F 8/433 |
| JP | 2003-202994 | 7/2003 | | G06F 9/45 |
| JP | 2004145589 | 5/2004 | | G06F 9/45 |
| JP | 2005-18767 | 1/2005 | | G06F 17/30 |
| JP | 06-180717 | 7/2006 | | G06F 12/00 |
| JP | 2011-161502 | 8/2011 | | B23K 11/14 |
| WO | WO2016161130 | 10/2016 | | G06F 9/45 |

OTHER PUBLICATIONS

Notice of Allowance issued in U.S. Appl. No. 14/368,265, dated Dec. 20, 2016 (22 pgs).
PCT Notice—Invitation to Pay Additional Fees issued in related PCT International Patent Application Serial No. PCT/US2016/066665, dated Jan. 30, 2017 (2 pgs).
Canadian Official Action issued in related Canadian Patent Application Serial No. 2,860,223, dated Jan. 25, 2017 (4 pgs).
Official Action issued in corresponding U.S. Appl. No. 14/968,827 dated Jan. 10, 2018, 47 pgs.
Japanese Decision to Grant (w/machine translation) issued in application No. 2014-548980, dated Sep. 26, 2017 (5 pgs).
International Preliminary Report on Patentability issued in application No. PCT/US2016/025295, dated Oct. 12, 2017 (9 pgs).
Japanese Office Action (w/machine translation) issued in application No. 2014-548980, dated Aug. 3, 2017 (6 pgs).
Notification for Reasons for Refusal issued in corresponding Japanese Appln. Serial No. 2014-548980, dated Sep. 30, 2016, with English translation (26 pgs).
International Search Report and Written Opinion issued in application No. PCT/US2016/025295, dated Jul. 29, 2016 (11 pgs).
Office Action issued in U.S. Appl. No. 14/368,265, dated May 31, 2016 (25 pgs).
International Search Report and Written Opinion issued in application No. PCT/US2016/066665, dated Apr. 27, 2017 (14 pgs).
Office Action issued in U.S. Appl. No. 14/968,827, dated Jun. 30, 2017 (49 pgs).
Bonwick et al., "The Slab Allocator: An Object-Caching Kernel Memory Allocator," Proceedings Usenix Technical Conference, pp. 87-98, Jun. 1994 (18 pgs).
Calder et al., "Value Profiling and Optimization," Journal of Instruction-Level Parallelism, vol. 1, Mar. 1999 (37 pgs).
Consel et al., "A General Approach for Run-Time Specialization and its Application to C," Institut de Recherche en Informatique et Systèmes Aléatoires, Jul. 1995 (24 pgs).
Consel et.al., "A tour of Tempo: a program specializer for the C language," Science of Computer Programming, vol. 52, No. 1-3, Aug. 2004 (30 pgs).
Eckstein, R., "Java SE Application Design With MVC," Oracle Technology Network, Mar. 2007 (8 pgs).

(56) References Cited

OTHER PUBLICATIONS

Elmasri et al., "Rindamentals of Database Systems," Addison Wesley Publishing Company, 6$^{th}$ Edition, Apr. 2010, book summary only (2 pgs).
Free Software Foundation, Inc., "Optimize Options—Using the GNu Compiler Collection (GCC), Options That Control Optimization," downloaded from https://gcc.gnu.org/onlinedocs/gcc/Optimize-Options.html on Feb. 11, 2015 (52 pgs).
International Preliminary Report on Patentability issued in corresponding application No. PCT/US2012/071468, dated Jun. 24, 2014 (6 pgs).
International Search Report issued in corresponding application No. PCT/US2012/071468, dated Apr. 19, 2013 (3 pgs).
Krikellas et al., "Generating code for holistic query evaluation," Proceedings of the IEEE International Conference on Data Engineering (ICDE), 2010, pp. 613-614 (13 pgs).
Linux Foundation, "Executable and Linking Format (ELF) Specification," TIS Committee, May 1995 (106 pgs).
Linux Foundation, "System V Application Binary Interface," Edition 4.1, Mar. 1997 (271 pgs).
Lussier, D., BenchmarkSQL project description and information, downloaded from http://pgfoundry.org/projects/benchmarksql/ on Feb. 11, 2015 (2 pgs).
Muth et al., "Code Specialization based on Value Profiles," Proceedings International Static Analysis Symposium (SAS), Jun. 2000 pp. 340-350 (20 pgs).
PostgreSQL Global Development Group, "18.4 Resource Consumption," PostgreSQL 8.4.22 Documentation, downloaded from http://www.postgresql.org/docs/8.4/static/index.html on Feb. 11, 2015 (9 pgs).
Supplemental European Search Report issued in application No. 12858918.1, dated Oct. 27, 2015 (9 pgs).
Transaction Processing Performance Council, "TPC BENCHMARK™-C," Revision 5.11, Feb. 2010 (132 pgs).
Transaction Processing Performance Council, "TPC BENCHMARK™-H," Revision 2.1.0 (150 pgs).
Valgrind Developers, "Callgrind: a call-graph generating cache and branch prediction profiler," Valgrind User Manual, Release 3.10.0, Sep. 10, 2014 (19 pgs).
European Office Action issued in application No. 12 858 918.1, dated Jul. 31, 2018 (6 pgs).
European Search Report issued in application No. 16774209.7, dated Jul. 26, 2018 (12 pgs).
Guravannavar, R., "Rewriting Procedures for Batched Bindings," Proceedings of the VLDB Endowment, Aug. 2008, pp. 1107-1123 (17 pgs).
International Preliminary Report on Patentability issued in application PCT/US2016/066665, dated Jun. 19, 2018 (10 pgs).
Office Action issued in U.S. Appl. No. 14/968,827, dated May 17, 2018 (52 pgs).
International Search Report and Written Opinion issued in application No. PCT/US18/39121, dated Sep. 14, 2018 (8 pgs).
Japanese Office Action (w/translation) issued in application No. 2017-206276, dated Aug. 31, 2018 (6 pgs).
U.S. Appl. No. 14/368,265, filed Jun. 23, 2014.
U.S. Appl. No. 14/968,827, filed Dec. 14, 2015.
U.S. Appl. No. 16/062,592, filed Jun. 14, 2018.
Japanese Decision to Grant (w/translation) issued in application No. 2017-206276, dated Feb. 6, 2019 (6 pgs).
Japanese Office Action (w/translation) issued in application No. 2017-206276, dated Dec. 13, 2018 (4 pgs).
Japanese Office Action (w/translation) issued in application No. 2018-502613, dated Dec. 4, 2018 (13 pgs).
Office Action issued in application No. 14/968,827, dated Dec. 20, 2018 (40 pgs).

* cited by examiner

BROADENING FIELD SPECIALIZATION

CROSS REFERENCE TO RELATED APPLICATIONS

This application is a continuation-in-part of application Ser. No. 14/368,265, filed Dec. 21, 2012, which claims priority to U.S. provisional patent application 61/630,993, filed on Dec. 23, 2011, which is hereby incorporated by reference in its entirety.

STATEMENT REGARDING FEDERALLY SPONSORED RESEARCH OR DEVELOPMENT

This invention was made with Government support under grants number IIS 0803229 and CNS0938948 awarded by NSF. The Government has certain rights in the invention.

FIELD OF THE INVENTION

The present disclosure is generally related to field specialization broadening to multiple application domains, and more particularly is related to systems and methods for broadening field specialization to extend particular values of the invariants beyond the source code of the application to the data sources themselves.

BACKGROUND OF THE INVENTION

A database management system (DBMS) is a collection of software programs that manage the storage and access of data. As larger volumes of data are being generated nowadays and thus must be stored and efficiently accessed, DBMSes have been adopted across a wide range of application domains. Driven by such ubiquitous deployments over the last four decades, DBMSes have been designed and engineered based on a few data models that are generally applicable to those domains. The relational data model is the one most prevalently adopted by commercial and open-source DBMSes. A significant amount of effort has been devoted to efficiently support this data model.

Due to the generality of the relational data model, relational database management systems are themselves general, in that they can handle whatever schema the user specifies and whatever query or modification is presented to them. Relational operators work on essentially any relation and must contend with predicates specified on any attribute of the underlying relations. Through such innovations as effective indexing structures, innovative concurrency control mechanisms, and sophisticated query optimization strategies, the relational DBMSes available today are very efficient. Such generality and efficiency has enabled their proliferation and use in many domains.

Nevertheless, such generality is realized via multiple layers of indirections and sophisticated code logic. Efficiency can be further enhanced for DBMSes by exploiting invariant values present during the execution of such systems. Field specialization technology has been developed to automatically identify invariants and effect code specialization based upon invariants. Field specialization is the process of inserting spiffs into DBMS code so that the DBMS can specialize itself at runtime to exploit runtime invariants. A spiff, which stands for specializer in the field, is code that dynamically creates specialized code at DBMS runtime. The specialized code is both smaller and faster than the original unspecialized code. Field specialization gets its name from the fact that the code is specialized "in the field," i.e., after the DBMS has been deployed and is miming at the end user's site. A spiff uses the actual value of a runtime invariant-which can only be known at runtime—to dynamically produce code that is specialized to that particular value of the runtime invariant.

It would be desirable to have the field specialization broadened to multiple application domains to elaborate a paradigm of computer science.

SUMMARY OF THE INVENTION

Embodiments of the invention relate to field specialization broadening to multiple application domains, and more particularly is related to systems and methods for broadening field specialization to extend particular values of the invariants beyond the source code of the application to the data sources themselves.

In accordance with one embodiment of the present invention, an ecosystem specification is disclosed to enable field specialization broadening. This specification states which (potentially multiple) applications are involved, what (potentially multiple) input data sources are read by one or more applications, what intermediate and final data products are produced by those applications, and what services are invoked by the applications, thereby providing valuable information on how intermediate results are communicated among the various applications.

Capturing in the ecosystem specification the input, intermediate, and final data sources along with the multiple applications participated in the computing allows field specialization to be broadened. The flow of particular values of the invariants may be extended beyond the source code of the application to the data sources themselves, across file read and write operations and even via network communication, such as passing the resulting data to the operating system (e.g., LINUX®), which then passes this data into the networking component, which then passes the data to other destinations.

In some embodiments, a static and/or a dynamic analysis determines that an invariant within a specialization opportunity arose even earlier than an assignment to a C variable within the application; rather, it arose from a data component at a particular location within an input data file, such as oil field data or a config parameter utilized by an oil-field simulation software. Once such a value flow is determined, spiffs are created in the appropriate applications and, when given a particular oil field data file, the spiffs are executed to produce a speccode of a specialization opportunity within the oil field simulator application. This speccode could be associated with the particular oil field data file, to be loaded dynamically into the oil field simulator application (or passed to the operating system or stored in the IBM® cluster) when that application is run. In this way, all of the applications involved in a computation can participate and be optimized, via a broadened conception of field specialization.

In some embodiments, the method of field specialization broadening comprises a sequence of steps: (i) deciding what (extended) invariants are there, (ii) deciding which of these extended invariants should be specialized upon, (iii) deciding what code sequence within a specialization opportunity should actually be specialized, (iv) deciding when to perform the specialization (and thus, within which application), (v) deciding where to store the generated speccode, and finally, (vi) deciding how to transfer the speccode to the site (application) where it will be invoked.

In some embodiments, the method of field specialization broadening comprises extending step (i) to include invariants that flow from external data or external applications, step (iv) to include spiffs located in an application separate from the application containing the source of the invariant that is being utilized by the spiff, or even autonomous from any application, and steps (v) and (vi) to include speccode stored separately from the application being specialized Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Various implementations and embodiments may be practiced in line with the specification. All of these implementations and embodiments are intended to be included within the scope of the invention.

DETAILED DESCRIPTION OF THE PREFERRED EMBODIMENTS

Many embodiments of the disclosure may take the form of computer-executable instructions, including algorithms executed by a programmable computer. However, the disclosure can be practiced with other computer system configurations as well. Certain aspects of the disclosure can be embodied in a special-purpose computer or data processor that is specifically programmed, configured or constructed to perform one or more of the computer-executable algorithms described below.

The disclosure also can be practiced in distributed computing environments, where tasks or modules are performed by remote processing devices that are linked through a communications network. Moreover, the disclosure can be practiced in Internet-based or cloud computing environments, where shared resources, software and information may be provided to computers and other devices on demand. In a distributed computing environment, program modules or subroutines may be located in both local and remote memory storage devices. Aspects of the disclosure described below may be stored or distributed on computer-readable media, including magnetic and optically readable and removable computer disks, fixed magnetic disks, floppy disk drive, optical disk drive, magneto-optical disk drive, magnetic tape, hard-disk drive (HDD), solid state drive (SSD), compact flash or non-volatile memory, as well as distributed electronically over networks including the cloud. Data structures and transmissions of data particular to aspects of the disclosure are also encompassed within the scope of the disclosure.

Moreover, while field specialization is disclosed herein primarily with respect to a DBMS, it should be understood that the concepts provided herein may be applied to any program that manipulates data and in particular, performs complex analysis on that data.

A "spiff," which stands for specializer in the field, is code that dynamically creates specialized code at DBMS runtime. "Field specialization" is the process of inserting spiffs into DBMS code so that the DBMS can specialize itself by exploiting runtime invariants. The specialized code (which may be referred to herein as "speccode") is both smaller and faster than the original unspecialized code. Field specialization gets its name from the fact that the speccode is generated and invoked "in the field," i.e., after the DBMS has been deployed and is running at the end user's site. A spiff uses the actual value of a runtime invariant—which is obtained at runtime—to dynamically produce code that is specialized to that particular value of the runtime invariant.

In Applicants' co-pending U.S. patent application Ser. No. 14/368,265, which the present application claims priority to, the term "micro-specialization" is equivalent to the term "field specialization" as used herein; the term "bee" is equivalent to the term "spiff" as used herein; an instantiated bee is equivalent to "specialized code" as used herein, which is the result of a spiff; and the HRE (hive runtime environment) is equivalent to "SRE" (spiff runtime environment) as used herein.

Figure 1:
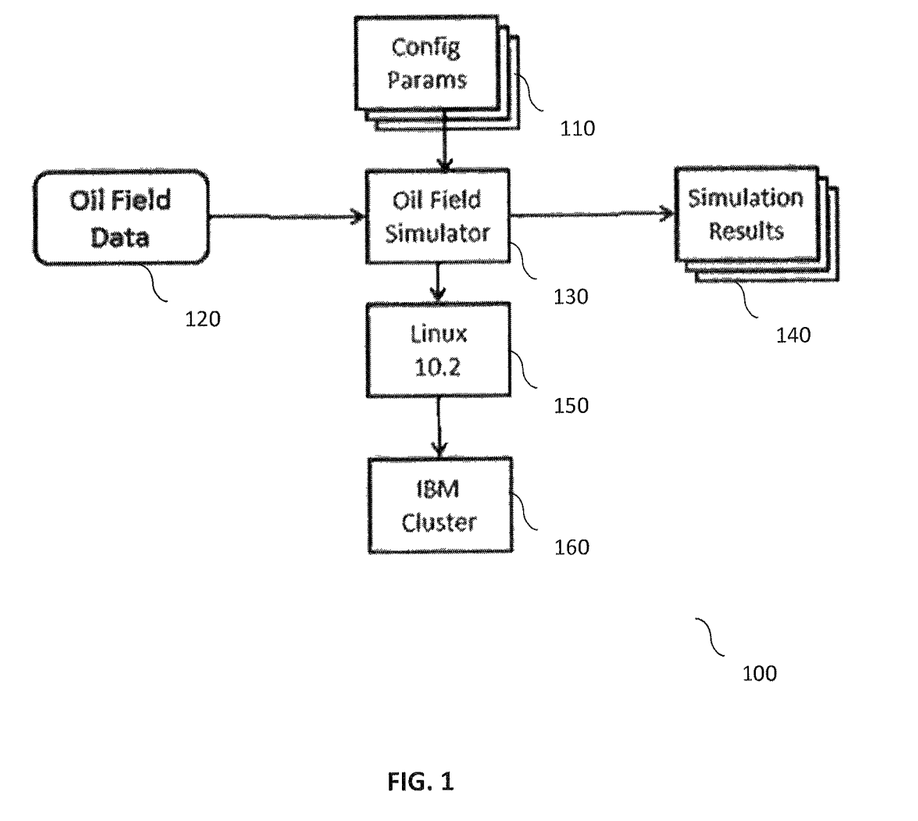
FIG. 1 is a block illustration of a single application field specialization process.

FIG. 1 is a block illustration of a single application field specialization process. The exemplary single application field specialization process 100 is related to an oil field over time. The single-application field specialization process has been disclosed and included in co-pending patent application with application No. 62/142,325 (Dataware 15.01-P). Both the initial field specialization and the broader one discussed here apply to any application domain that processes the same data multiple times.

Referring to FIG. 1, a simulator 130 receives inputs from a field dependent source data 120 and a user-defined parameter 110. As shown in FIG. 1, the field dependent source data 120 ("oil field data") specifies a structure of an oil field, a three-dimensional assemblage of rock structures, some of which hold various mixtures of oil, gas, water at various pressures and some of which are impermeable. The user-defined parameter 110 (also referred as "config params" or workload) specifies wells to be drilled at various times and fluids to be extracted at various rates over time. The simulator 130 then computes how the fluids flow throughout the oil field over time, over simulated time of perhaps many years, producing a "simulation result". The simulations may be implemented many times, each time with a different user-defined parameter 110 and with a single simulation result 140 as an output. In some embodiments, the simulator may pass the simulation result 140 to a LINUX® operation system 150, which then passes the data to a computer cluster (such as an IBM® cluster) 160.

Although FIG. 1 is shown with the exemplary oil field related application, it is understood that the single application field specialization process may be applicable to various fields.

In some embodiments, the oil field simulator may be written in a high-level language such as C. A Spiff toolset (shown in FIG. 2) that analyzes the simulator can follow the flow of values through this C program, flowing from cold code into hot code as a data value is copied from one C variable, perhaps within a complex data structure, to another. The Toolset can then identify specialization opportunities: segments of hot code, that is, a program component that's frequently executed, containing variables that are invariant at runtime. The values of these variables are known to have originated in cold code (i.e., written once) and are used (i.e., read many) in branching or other statements in hot code, such that by knowing the particular value of an invariant, the identified hot code segment may be specialized to run faster, say by removing a branch statement along with the dead branch(es) from hot code. The specialization opportunities enable the creation of spiffs, which are placed in the cold code and can produce specialized code (abbreviated as speccode).

The aforementioned field specialization focuses on the source code of the application, such as the oil field simulator shown in FIG. 1, performing static and dynamic analysis to identify invariants (C variables) and specialization opportunities (segments of code) that can then be specialized given a particular value for each relevant invariant.

Figure 2:
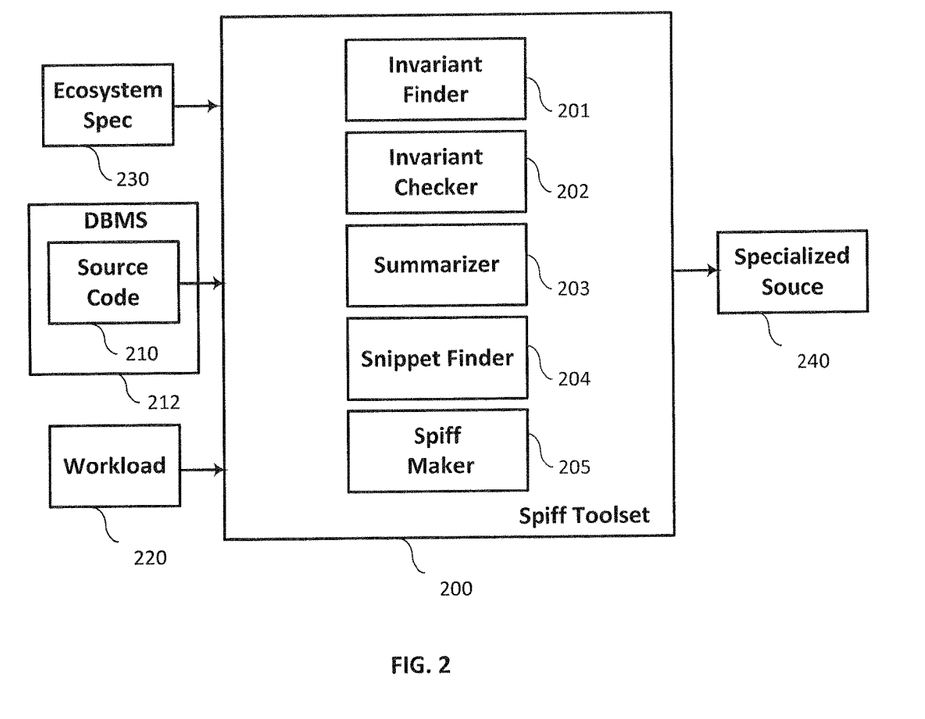
FIG. 2 is a block diagram illustrating the spiff toolset, in accordance with an exemplary embodiment provided by this disclosure.

FIG. 2 is a block diagram illustrating a spiff toolset, in accordance with an exemplary embodiment provided by this disclosure. The spiff tool toolset 200 receives inputs as an Application's source code (or application code) 210, one or more workload 220, and an Ecosystem Specification 230 (referred to herein as "Ecosystem Spec") and outputs a Specialized Source Code 240. In some embodiments, a graphical user interface (GUI) is placed at a higher level than the Spiff Tools to be used by the application developer to request that the tools be executed in sequence and to visualize how the field specialization was achieved, by showing in an appropriate manner the intermediate and generated results. This GUI also provides actions that the developer can perform that will impact the operation of other tools. In some embodiments, the spiff tool toolset 200 is constructed as a field specialization broadening module. In one embodiment, the source code 210 is a DBMS source code comprised within a DBMS 212 of one application.

The spiff tool toolset 200 provides an end-to-end solution that takes source files for a program or suite of related programs and automatically provides field-specialized versions of those source files, including the code for spiff generation, spiff compilation, spiff instantiation, spiff invocation, and spiff garbage collection. In some embodiments, the spiff toolset 200 includes a number of tools, including but not limited to an invariant finder 201, an invariant checker 202, a summarizer 203, a snipper finder 204, and a spiff maker 205. The invariant finder 201 may couple to both the Application's source code 210 and one or more workloads 220 and perform static analysis on the AST and output zero or more Invariant Intervals. The invariant checker 202 ensures the validity of output Invariant Intervals from the invariant finder 201. The summarizer 203 produces execution summaries, which provide output as a list of functions, statements, and variables along with their execution statistics. Such information indicates "hot spots" within the application that could benefit from field specialization. The Snippet Finder 204 first expands invariants to across program executions by tracking which variables are read from files and where those values are put into files. This results in invariant intervals that span multiple executions. The tool also tracks when the value was first written to the file and when it is deleted. The Spiff maker 205 takes one or more Candidate Snippets as input and output the Specialized Source Code 240.

In some embodiments, the aforementioned tools within the spiff toolset 200 are placed within a single computer apparatus. In some embodiments, the aforementioned tools within the spiff toolset 200 are placed among distributed computers.

The Ecosystem Specification 230 provides additional information that enables the analysis performed by the simulator 130 to be broadened considerably. The specification 230 states which (potentially multiple) applications are involved, what (potentially multiple) input data sources are read by one or more applications, what intermediate and final data products are produced by those applications, and what services are invoked by the applications, thereby providing valuable information on how intermediate results are communicated among the various applications. Thus the Ecosystem Specification 230 may capture a bigger picture beyond the single oil field simulator 130, which only takes a single "oil field data" source and one "config params" data source as inputs to produce a single "simulation result" data product.

Capturing in the Ecosystem Specification 230, the input, intermediate, and final data sources along with the multiple applications that participate in the computing process allows field specialization to be broadened such that the flow of particular values of the invariants may be extended beyond the source code of a single application. Furthermore, field specialization broadening also enables across file RW (read/write) operations and even operations via network communication, such as passing the resulting data to an operating system such as LINUX® and to other destinations. In some embodiments, static and dynamic analysis may determine that an invariant within a specialization opportunity arose even earlier than an assignment to a C variable within the single application. Instead, the invariant is extracted from a data component at a particular location within an input, such as the oil field data or the config parameters. Once such a value flow is determined, spiffs may be created in the appropriate applications. When an oil field data file is given, the spiffs is executed to produce speccode of specialization opportunity within the oil field simulator application. This speccode could be associated with the particular oil field data file, to be loaded dynamically into the oil field simulator application (or passed to the LINUX® OS 150 or stored in the IBM® cluster 160) when that application is run. In this way, all of the applications involved in a computation can participate and be optimized, via a broadened conception of field specialization.

At least three exemplary extensions may be implemented for field specialization broadening.

The first extension to field specialization is cross-application value flows (where a value transfers out of one application and subsequently into another application), specified by the ecosystem spec for how data travels from one application to another. Within a single application, as viewed by field specialization, a value flows from one C variable to another via a data copy, implemented with low-level load and store operations. With the availability of an ecosystem spec, additional kinds of transfers can be accommodated in the invariant flow analysis. For instance, one such transfer is passing a value as a parameter (which can be a structure) to an operating system call and receiving a return value from a system call can establish data flow between an application and the OS. In addition, the ecosystem spec can support specification of other means of communication, such as exchanging data across devices. For example, a graphics processing unit (GPU) may communicate with a central processing unit (CPU) over a memory bus, with values copied via network communication channels, such as sockets. The ecosystem spec annotates a plurality of connecting paths with the means for such value transfers and the Spiff Toolset analysis utilizes such transfers to extend the value flows, thereby identifying additional cross-application value flows and additional specialization opportunities within each of the participating applications.

The second extension to field specialization is an inter-application analysis. The static and dynamic analysis is performed by the Spiff Toolset not just on the source code of a single application, but also across the data read and written by that application. That analysis may be similarly extended to other applications or operating systems invoked by an application, such as the LINUX® operating system, or storing invariant values, such as within an IBM® cluster, shown in FIG. 1. A particular value within the oil field data flows into the oil field simulator application, then flows into the LINUX® operating system as a system call parameter or as data passed through a system call, then flows into the IBM® cluster. This same value may flow back into the simulator from the LINUX® O/S as an operating system return value or data value returned. A complex data flow may travel back and forth between the three applications illustrated here, across different system calls and within different C functions in each of these applications. Inter-application analysis combines the per-application value flow analysis, performed by the Spiff Toolset, with analysis of data read by application or sent from one application to another. Inter-application analysis need to understand the semantics of the cross-application value flows and be able to combine value flows within a single application to compute value flows across applications. Furthermore, inter-application analysis is able to determine where the speccode that is associated with particular invariants can be best instantiated.

The third extension to field specialization is invariant cross-application termination, verifying the possibility of an invariant originating in an application (or data source or product) and terminating in a specialization opportunity in a separate application. This enables flexibility in placing the spiff, in associating speccode with a data source or product or application, and in shipping the speccode to the destination application. The Spiff Toolset can determine where the speccode can be best stored and subsequently communicated to the relevant application where it will be installed. The Spiff Runtime Environment needs mechanisms to handle the variations enabled by the structure provided by an ecosystem spec.

Figure 3:
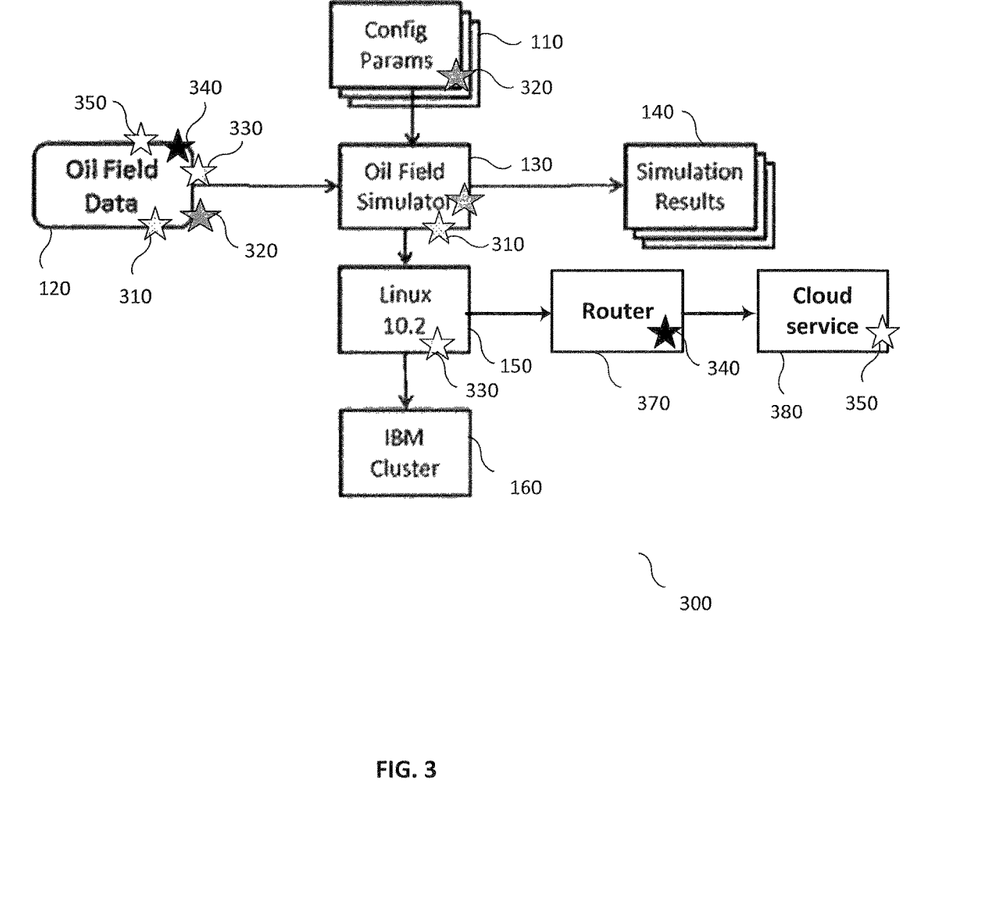
FIG. 3 is a block illustration of a field specialization broadening process involving three extensions in accordance with an embodiment of the present invention.

FIG. 3 is a block illustration of a field specialization broadening process involving the three extensions just described, in accordance with an embodiment of the present invention. Comparing to the field specialization process 100 for single application shown in FIG. 1, the field specialization broadening process 300 comprises additionally a router 370 (a hardware device that now comes with significant computation capacity) and a cloud service 380 (including data analytics). The router 370 receives inputs from the LINUX® operation system 150 and passes the inputs to the cloud service 380.

The stars in FIG. 3 represent speccode created by spiffs (not shown) that were added through the broadened field specialization process. The spiffs are added to utilize the value flows described above. The field specialization process determines where the Speccode should be stored. For example, speccode 310 may involve invariants both from the oil field data 120 and the oil field simulator 130. Speccode 320 may involve invariants both from the config params 110 and the oil field simulator 130. Speccode 330 stored in the LINUX® operating system 130 may involve invariants from the simulator and oil field data. Speccode 340 stored in the router 370 and Speccode 350 stored in the cloud 380 may also involve invariants from the simulator and the oil field data.

The speccode stored within the simulator may originate from the oil field data and from the simulator itself, and may be identified through basic field specialization. Other spiffs are stored with the operating system, router, and cloud, specializing code found in the indicated applications. In some embodiments, speccodes may flow from where they are stored to where they may be invoked (the application that provided the specialization candidate from which they were subsequently specialized). For example, the oil field data may store the router speccode 340. In some embodiments, speccode identifiers can reside with data or with applications and can also be included in communications with subsequent applications, indicating the relevant speccode to (later) invoke.

Below are two exemplary fields which the original oil field specialization may be broadened to cover.

Web applications: A backend web server is responsible for processing input data obtained from user activities at the front-end, i.e., in web browsers that run JAVASCRIPT® applications. The user inputs can vary and hence present different patterns within the data collected at the backend. The backend server can then produce client (JAVASCRIPT®) speccode for different value patterns that can then be pushed to the (appropriate) browsers.

Data Center Work Distribution:

A distributor for work packets is common in big data applications (such as Hadoop). The distributor is an application that can parcel out the work based on certain attributes, which can then serve as invariants to specialize the tasks running on different worker nodes. In this case also, the spiff and the speccode it generates is in an application separate from the invoked application.

Figure 4:
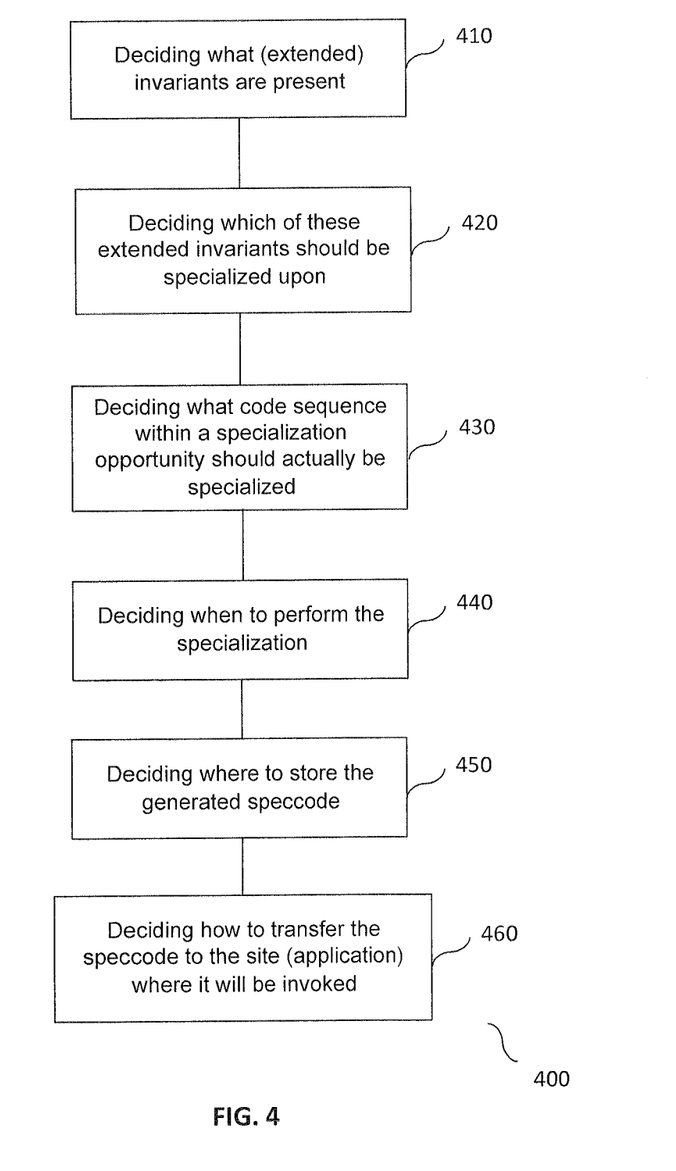
FIG. 4 is an illustration of a flow process of broadened field specialization with an embodiment of the present invention.

FIG. 4 is an illustration of a flow process of broadened field specialization with an embodiment of the present invention. In broadened field specialization, there is a sequence of decisions to be made. The flow process of broadened field specialization 400 shown in FIG. 4 comprising a plurality of steps to address the sequence of decisions. Step 410 is deciding what (extended) invariants are present; Step 420 is deciding which of these extended invariants should be specialized upon; Step 430 is deciding what code sequence within a specialization opportunity should actually be specialized; Step 440 is deciding when to perform the specialization (and thus, within which application); Step 450 is deciding where to store the generated speccode, and finally, Step 460 is deciding how to transfer the speccode to the site (application) where it will be invoked. Although the steps shown in FIG. 4 are related to broadened field specialization, it is understood that the steps are also applicable to conventional field broadening, since the steps are necessary for field specialization in general.

Figure 5:
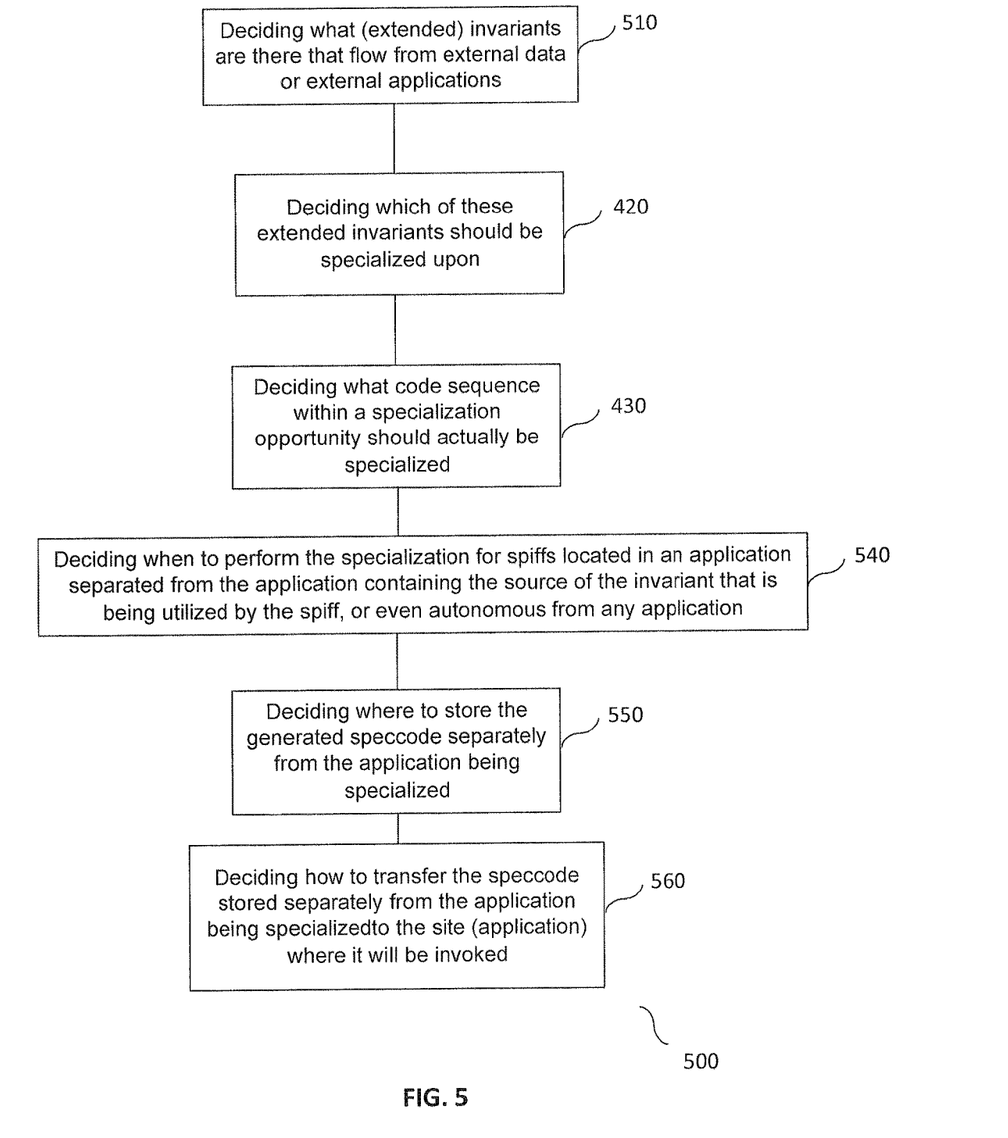
FIG. 5 is an illustration of an alternative flow process of broadened field specialization with an embodiment of the present invention.

FIG. 5 is an illustration of an alternative flow process of broadened field specialization with an embodiment of the present invention. Compared to the field specialization process shown in FIG. 4, step 510 in FIG. 5 is extended to invariants that flow from external data or external applications; step 540 in FIG. 5 is extended to spiffs located in an application separated from the application containing the source of the invariant that is being utilized by the spiff, or even autonomous from any application, and steps 550 and 560 in FIG. 5 are extended to speccode stored separately from the application being specialized.

The flow process of broadened field specialization disclosed within this disclosure may be stored as computer executable instructions within a non-transitory computer readable medium and executable by a processor of a computing device. In some embodiments, the specialization broadening process may be executed by a plurality of computers with different computers executing different process steps.

Figure 6:
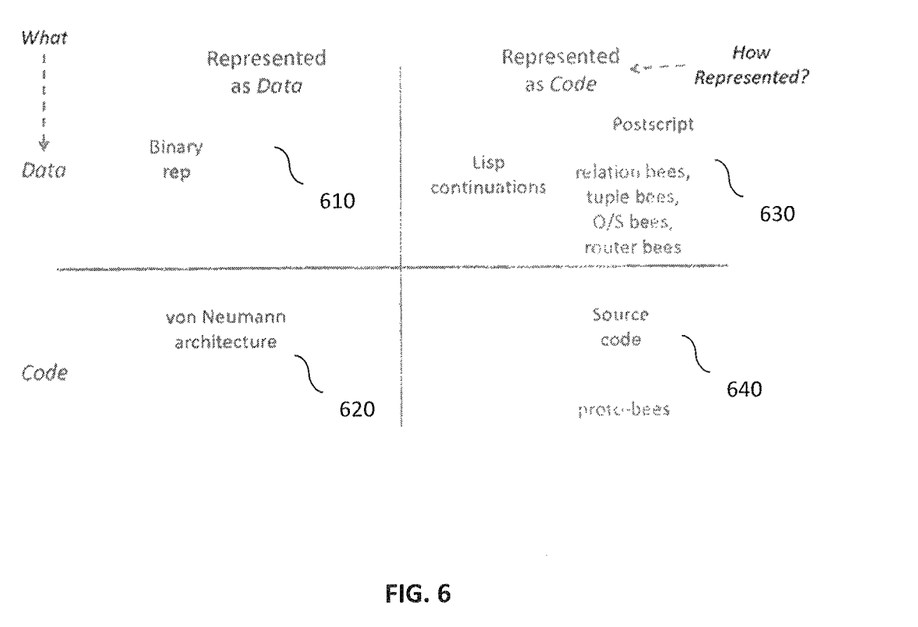
FIG. 6 is an illustration of field specialization for elaboration a paradigm of computer science with an embodiment of the present invention.

FIG. 6 is an illustration of Field specialization for elaboration a paradigm of computer science with an embodiment of the present invention. The diagram comprises four quadrants 610, 620, 630 and 640 for scenarios of data represented as data, code represented as data, data represented as code, and code represented as code respectively.

In the early stages of computer architecture, from the Babbage machine through the 1930's, data was differentiated from code. The data was what was manipulated and the program code was the instructions for how to manipulate the data to effect a computation. This is represented in quadrants 610 and 640 in FIG. 6 as data represented in binary format in a computer memory or storage device, that is, data stored as data, and source code represented in some other way (e.g., patch cords), that is, code represented as code.

In the 1940's, John von Neumann proposed a revolutionary architecture that stored the program in machine code in the computer's memory as numbers, mixing code and data. (Indeed, the code can be manipulated as data, and even changed during the running of the program.) This architecture is represented in quadrant 620, with code (machine instructions) represented as data.

In the 1960's there were some initial forays into combining code, in the form of a Lisp function, with data, say the value of one of the arguments, to produce a List continuation, which is a Lisp function (code) paired with the value of that parameter, which is just a function with one less argument. This is in a very particular way that data are stored/encapsulated in code, as represented in quadrant 630.

In the 1980's the Postscript language was invented. This was code that when executed would create an image. Postscript is produced by a formatter, taking a document such as a MICROSOFT® Word file, which is data, and converting to a program, again, code as data, as represented in quadrant 620.

Field specialization takes this idea further. Field specialization takes the values of invariants, that is, data, and uses these values to create a specialized code version of a portion of an application, such as a DBMS, which is code that can be executed. So a relation speccode is the result of specializing DBMS code using the schema of a relation (data). A tuple speccode is the result of using the data values within a tuple (row of a table). An O/S speccode is a specialization of a snippet of an operating system based on particular data values of particular invariants within that snippet; ditto for router speccodes.

This data-represented-as-code (as represented in quadrant 630) can be created in one application from a snippet in that application or another application, passed around between applications, and invoked by the target application when appropriate. The field specialization technology provides the means for identifying when such speccode are effective in increasing performance, when they should be created, with which invariants should they be specialized upon, how they can be communicated across applications, and when they should be invoked.

The implication is that for any coherent region within a data file, it is possible to ascertain the invariant values within that region, follow those values into areas of the application code, and then make speccodes out of those areas, then associate those speccodes back to their regions. This perspective thus focuses on the originating data, rather than starting with the code and specializing it, which then opens up new opportunities and technology.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A computer-implemented method for field specialization broadening, the method comprising:
receiving inputs from source code of an application and one or more workload run on the application;
performing static and dynamic analysis on the source code based on data read and written by the application to identify at least one invariant within the source code while executing the one or more workload;
dynamically creating at least one specializer in applications receiving the at least one identified invariant;
executing the at least one specializer for specialization to produce at least one specialized code of the source code for the applications; and
dynamically loading the at least one specialized code into at least one of the applications receiving the at least one identified invariant, specifying cross-application value flows of the at least one identified invariant by an ecosystem specification that captures input, intermediate, and final data sources along with the applications to extend the value flows across the applications for how data associated with the at least one identified invariant travels from one application to another, wherein the ecosystem specification specifies the cross-application value flows by annotating a plurality of connecting paths with means of communication to extend the value flows.

2. The computer-implemented method of claim 1 wherein an inter-application analysis is implemented to determine where the at least one identified invariant can be best instantiated.

3. The computer-implemented method of claim 1 wherein the computer-implemented method further comprises identifying invariants that flow from external data or external applications.

4. The computer-implemented method of claim 1 wherein the computer-implemented method further comprises deciding when to perform the specialization for a specializer located in an application separated from the applications containing the identified at least one invariant.

5. The computer-implemented method of claim 1 wherein dynamically loading the at least one specialized code comprises storing the at least one specialized code separately from the application being executed with the at least one specializer.

6. A non-transitory computer readable medium comprising computer executable instructions that, when executed by a processor of a computing device, cause the computing device to:
   receive an application code of an application and one or more workload run on the application;
   perform static and dynamic analysis on the source code based on data read and written by the application to identify at least one invariant within the source code and the one or more workload;
   dynamically create at least one specializer in applications receiving the identified at least one invariant;
   execute the at least one specializer for specialization to produce at least one specialized code of the source code for the applications; and
   dynamically load the at least one specialized code into at least one of the applications receiving the at least one identified invariant, specifying cross-application value flows of the at least one identified invariant by an ecosystem specification that captures input, intermediate, and final data sources along with the applications to extend the value flows across the applications for how data associated with the at least one identified invariant travels from one application to another, wherein the ecosystem specification specifies the cross-application value flows by annotating a plurality of connecting paths with means of communication to extend the value flows, wherein the computing device is further configured to extend an inter-application analysis to understand semantics of the cross-application value flows and to combine value flows within a single application to compute value flows across the applications.

7. The non-transitory computer readable medium of claim 6 wherein the inter-application analysis is implemented to determine where the identified at least one invariant can be best instantiated.

8. The non-transitory computer readable medium of claim 6 wherein the computing device is further configured to verify the possibility of the identified at least one invariant originating in an application and terminating in a specialization opportunity in a separate application.

9. The non-transitory computer readable medium of claim 6 wherein the computing device is further configured to identify invariants that flow from external data or external applications.

10. The non-transitory computer readable medium of claim 6 wherein the computing device is further configured to decide when to perform the specialization for a specializer located in an application separated from the applications containing the identified at least one invariant.

11. The non-transitory computer readable medium of claim 6 wherein the at least one specialized code is stored separately from the application being executed with the at least one specializer.

12. A computer-implemented method for field specialization broadening, the method comprising:
   receiving inputs from source code of an application and one or more workload run on the application;
   performing static and dynamic analysis on the source code based on data read and written by the application to identify at least one invariant within the source code while executing the one or more workload;
   dynamically creating at least one specializer in applications receiving the at least one identified invariant;
   executing the at least one specializer for specialization to produce at least one specialized code of the source code for the applications;
   dynamically loading the at least one specialized code into at least one of the applications receiving the at least one identified invariant, specifying cross-application value flows of the at least one identified invariant by an ecosystem specification that captures input, intermediate, and final data sources along with the applications to extend the value flows across the applications for how data associated with the at least one identified invariant travels from one application to another, wherein the ecosystem specification specifies the cross-application value flows by annotating a plurality of connecting paths with means of communication to extend the value flows and extending an inter-application analysis to understand semantics of the cross-application value flows and to combine value flows within a single application to compute value flows across the applications.

13. The computer-implemented method of claim 12 wherein the inter-application analysis is implemented to determine where the at least one identified invariant can be best instantiated.

14. The computer-implemented method of claim 12 wherein the computer-implemented method further comprises verifying the possibility of the identified at least one invariant originating in an application and terminating in a specialization opportunity in a separate application.

15. The computer-implemented method of claim 12 wherein the computer-implemented method further comprises identifying invariants that flow from external data or external applications.

16. The computer-implemented method of claim 12 wherein the computer-implemented method further comprises deciding when to perform the specialization for a specializer located in an application separated from the applications containing the identified at least one invariant.

17. The computer-implemented method of claim 12 wherein dynamically loading the at least one specialized code comprises storing the at least one specialized code separately from the application being executed with the at least one specializer.

18. A computer-implemented method for field specialization broadening, the method comprising:
   receiving inputs from source code of an application and one or more workload run on the application;
   performing static and dynamic analysis on the source code based on data read and written by the application to identify at least one invariant within the source code while executing the one or more workload;
   dynamically creating at least one specializer in applications receiving the at least one identified invariant;
   executing the at least one specializer for specialization to produce at least one specialized code of the source code for the applications; and
   dynamically loading the at least one specialized code into at least one of the applications receiving the at least one identified invariant, specifying cross-application value flows of the at least one identified invariant by an ecosystem specification that captures input, intermediate, and final data sources along with the applications to extend the value flows across the applications for how data associated with the at least one identified invariant travels from one application to another, wherein the ecosystem specification specifies the cross-application value flows by annotating a plurality of connecting paths with means of communication to extend the value flows and verifying the possibility of the identified at least one invariant originating in an application and terminating in a specialization opportunity in a separate application.

19. The computer-implemented method of claim 18 wherein the computer-implemented method further comprises identifying invariants that flow from external data or external applications.

20. The computer-implemented method of claim 18 wherein the computer-implemented method further comprises deciding when to perform the specialization for a specializer located in an application separated from the applications containing the identified at least one invariant.

21. The computer-implemented method of claim 18 wherein dynamically loading the at least one specialized code comprises storing the at least one specialized code separately from the application being executed with the at least one specializer.

\* \* \* \* \*